United States Patent
Liao

(10) Patent No.: US 11,322,377 B2
(45) Date of Patent: May 3, 2022

(54) STACKING STRUCTURE APPLICABLE TO MANUFACTURING CIRCUIT BOARD

(71) Applicant: Unimicron Technology Corp., Taoyuan (TW)

(72) Inventor: Po-Hsuan Liao, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 17/016,356

(22) Filed: Sep. 9, 2020

(65) Prior Publication Data

US 2020/0411349 A1    Dec. 31, 2020

Related U.S. Application Data

(62) Division of application No. 15/815,719, filed on Nov. 17, 2017.

(30) Foreign Application Priority Data

Sep. 28, 2017  (TW) .................................. 106133447

(51) Int. Cl.
| | | |
|---|---|---|
| H01L 21/673 | (2006.01) | |
| H01L 21/02 | (2006.01) | |
| H01L 21/67 | (2006.01) | |
| H05K 3/46 | (2006.01) | |
| H05K 3/38 | (2006.01) | |

(52) U.S. Cl.
CPC .. *H01L 21/67346* (2013.01); *H01L 21/02008* (2013.01); *H01L 21/67132* (2013.01); *H05K 3/4673* (2013.01); *H05K 3/381* (2013.01); *H05K 2203/0191* (2013.01); *H05K 2203/1152* (2013.01)

(58) Field of Classification Search
CPC ................. H05K 3/381; H05K 3/4673; H05K 2203/0191; H05K 2203/1152; H01L 21/02008; H01L 21/67132; H01L 21/67346
See application file for complete search history.

(56) References Cited

U.S. PATENT DOCUMENTS

| | | | |
|---|---|---|---|
| 5,699,613 | A | 12/1997 | Chong et al. |
| 6,143,116 | A | 11/2000 | Hayashi et al. |

(Continued)

FOREIGN PATENT DOCUMENTS

| | | |
|---|---|---|
| CN | 1294835 A | 5/2001 |
| CN | 1823557 A | 8/2006 |

(Continued)

*Primary Examiner* — Carl J Arbes
(74) *Attorney, Agent, or Firm* — CKC & Partners Co., LLC

(57) ABSTRACT

A stacking structure is applicable to manufacturing a circuit board. The stacking structure includes a transferring layer and a dielectric layer disposed on the transferring layer. The transferring layer includes a substrate and a thin film disposed on the substrate and having a plurality of recess structures thereon. The recess structures are connected as a single piece and bottom portions and top portions of the recess structures are configured to arrange in a staggered manner to form a multi-dimensional arrangement. At least a portion of the dielectric layer being is located in the recess structures, such that the dielectric layer is at least embedded with the recess structures.

9 Claims, 11 Drawing Sheets

(56) References Cited

U.S. PATENT DOCUMENTS

| | | |
|---|---|---|
| 6,195,882 B1 | 3/2001 | Tsukamoto et al. |
| 6,320,140 B1 | 11/2001 | Enomoto |
| 6,459,046 B1 | 10/2002 | Ochi et al. |
| 6,839,964 B2 | 1/2005 | Henson |
| 6,871,396 B2 | 3/2005 | Sugaya et al. |
| 7,168,936 B2 | 1/2007 | Padovani |
| 8,021,748 B2 | 9/2011 | Asai et al. |
| 9,661,763 B2 | 5/2017 | Kurafuchi et al. |
| 2012/0295435 A1 | 11/2012 | Yoneda |
| 2015/0382473 A1 | 12/2015 | Okamoto et al. |
| 2018/0310413 A1 | 10/2018 | Kasai et al. |

FOREIGN PATENT DOCUMENTS

| | | | |
|---|---|---|---|
| CN | 104002579 A | | 8/2014 |
| CN | 106922088 A | | 7/2017 |
| JP | 10107448 A | * | 4/1998 |
| JP | 3670487 B | * | 1/2000 |
| JP | 2000133916 A | | 5/2000 |
| JP | 2000164767 A | * | 6/2000 |
| JP | 2002076637 A | | 3/2002 |
| TW | 201720262 A | | 6/2017 |
| TW | 201733765 A | | 10/2017 |
| WO | 2017057263 A1 | | 4/2017 |

\* cited by examiner

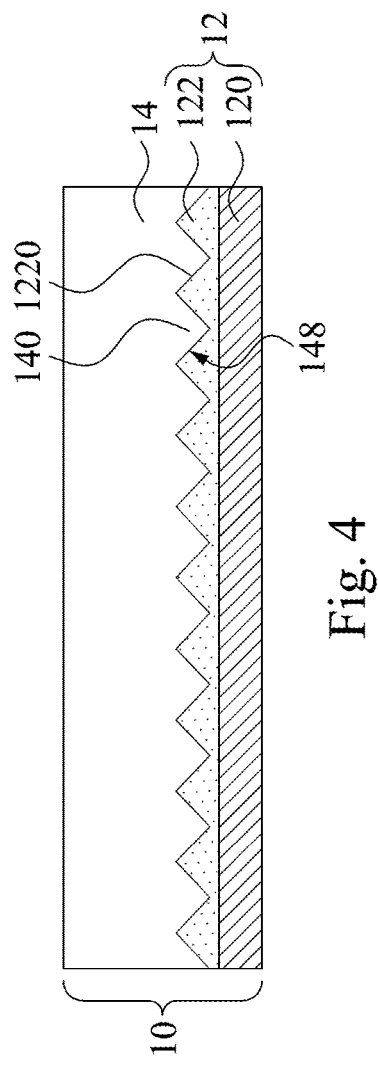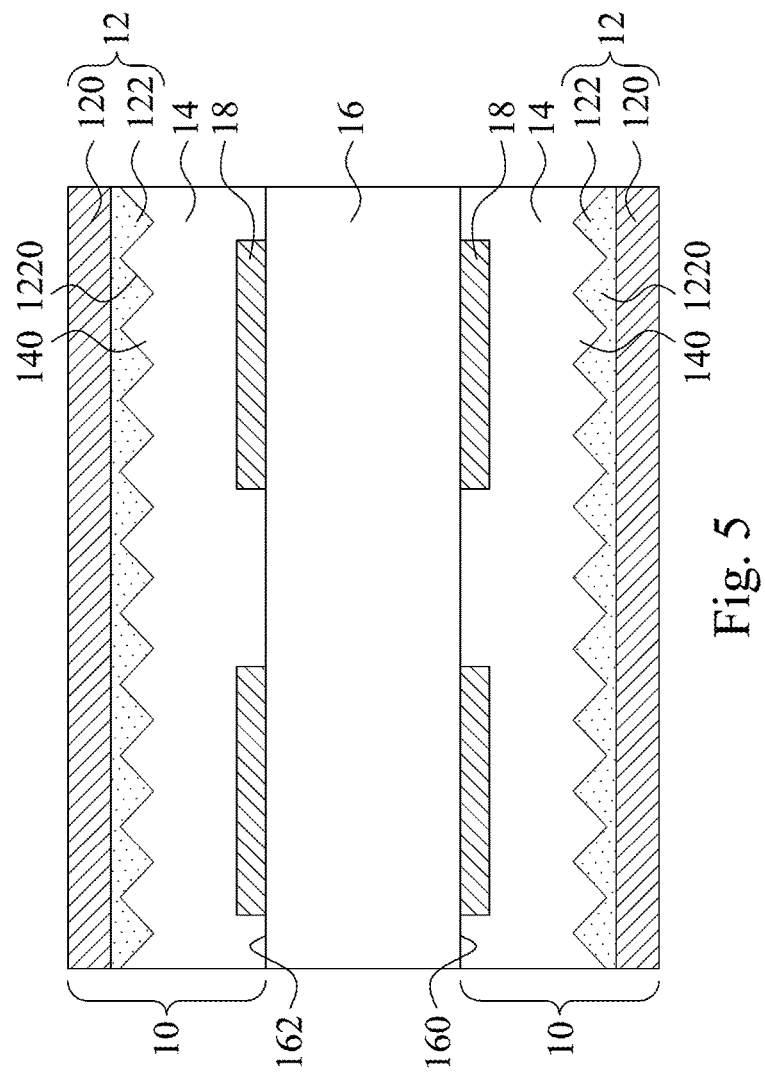

STACKING STRUCTURE APPLICABLE TO MANUFACTURING CIRCUIT BOARD

The present application is a Divisional Application of the U.S. application Ser. No. 15/815,719, filed Nov. 17, 2017, now U.S. Pat. No. 10,804,126, in which application claims priority to Taiwan Application Serial Number 106133447, filed Sep. 28, 2017, which is herein incorporated by reference in its entirety.

BACKGROUND

Field of Invention

The present disclosure relates to a circuit board, and especially relates to a circuit board to which a transferring layer is applied.

Description of Related Art

A circuit board is a part needed for an electronic device, such as a mobile phone or a computer, and/or a household application, such as a television, a washing machine, or a refrigerator. In detail, the circuit board can carry a variety of electronic components, such as a chip, a passive component, an active component, or a microelectromechanical system (MEMS) thereon. As such, current can be transmitted via the circuit board to the aforementioned electronic components, thereby operating the electronic device and/or the household application.

SUMMARY

The present disclosure provides a method for manufacturing a circuit board. The method includes forming a plurality of recess structures on a transferring layer; forming a dielectric layer on the transferring layer to form a stacking structure, in which the dielectric layer is at least embedded with the recess structures; bonding the stacking structure to a base board by pressing, such that the dielectric layer is in contact with the base board; patterning the dielectric layer, including performing an exposure process on the stacking structure through the transferring layer; and after the exposure process is finished, removing the transferring layer.

In some embodiments of the present disclosure, forming the recess structures on the transferring layer includes: forming a thin film on a substrate to form the transferring layer; and forming a pattern on the thin film to form the recess structures by performing a transferring process.

In some embodiments of the present disclosure, the method further includes curing the thin film by performing a curing process after forming the pattern on the thin film.

In some embodiments of the present disclosure, forming the dielectric layer on the transferring layer transfers the recess structures to protruding structures on a side of the dielectric layer facing the transferring layer.

In some embodiments of the present disclosure, the method further includes before pressing the stacking structure, forming a first circuit layer on the base board. Pressing the stacking structure causes the first circuit layer to be embedded in the dielectric layer.

In some embodiments of the present disclosure, the patterning the dielectric layer includes: before removing the transferring layer, the exposure processing forms an exposure region and a non-exposure region on the dielectric layer; and after removing the transferring layer, performing a developing process on the unexposed dielectric layer.

In some embodiments of the present disclosure, the method further includes: forming a second circuit layer on the patterned dielectric layer. The second circuit layer is at least embedded in the non-exposure region of the dielectric layer.

In some embodiments of the present disclosure, a refractive index of the dielectric layer is substantially the same as a refractive index of the transferring layer.

In some embodiments of the present disclosure, forming the recess structures is performed by arranging the recess structures on the transferring layer in a multi-dimensional arrangement.

The present disclosure provides a stacking structure applicable to manufacturing a circuit board. The stacking structure includes a transferring layer and a dielectric layer. The transferring layer includes a substrate and a thin film. The thin film is disposed on the substrate and has recess structures arranged in a multi-dimensional arrangement. The dielectric layer is disposed on the transferring layer. At least one portion of the dielectric layer is located in the recess structures, such that the dielectric layer is at least embedded with the recess structures.

In the aforementioned configurations, because the protruding structures on the dielectric layer is complementary to the recess structures on the transferring layer by using the transferring process, the protruding structures have substantially the same roughness surface area ratio (RSAR) as the recess structures. Therefore, the RSAR of the protruding structures is controlled by the recess structures on the transferring layer, thereby increasing a contact area between the conducting circuit and the dielectric layer, and enhancing a binding force between the conducting circuit and the dielectric layer to miniaturize the line width of the conducting circuit, and prevent the conducting circuit from being separated from the dielectric layer, in which the separation of the conducting circuit and the dielectric layer which may cause the circuit board to have a blister problem in subsequent processes.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 1-12 are cross-sectional views of a circuit board at various stages of fabrication in accordance with some embodiments of the present disclosure, in which

DETAILED DESCRIPTION

Figure 1:
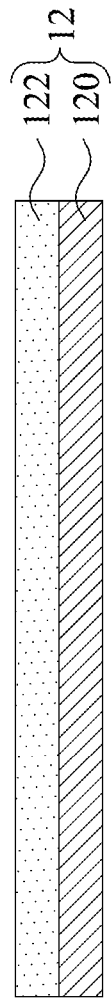

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIGS. 1 to 12. FIGS. 1-12 are cross-sectional views of a circuit board 1 (labeled in FIG. 12) at various stages of fabrication in accordance with some embodiments of the present disclosure.

As shown in FIG. 1, a substrate 120 is provided. Subsequently, a thin film 122 is formed on the substrate 120 to form a transferring layer 12. That is, the transferring layer 12 of the present disclosure includes the substrate 120 and the thin film 122, and is applicable to manufacturing the circuit board 1. In some embodiments, the method for forming the thin film 122 on the substrate 120 includes a coating process, deposition process, or any other suitable process. For example, the deposition process may include a spin coating process, a slot coating process, a gravure coating process, a comma coating process, a physical vapor deposition (PVD) process, or any other suitable process. In some embodiments, the substrate 120 is formed from a material, such as polyethylene terephthalate (PET), but the present disclosure is not limited thereto.

In some embodiments, the thin film 122 is depicted as a single layer structure. However, in other embodiments, the thin film 122 may be a multilayer structure. The thin film 122 of the present disclosure is formed from such as epoxy, acrylic resin, or cyclic-Olefin, and a thickness thereof is less than about 5 μm, but the present disclosure is not limited thereto. A refractive index of the thin film 122 and a refractive index of the substrate 120 of the present disclosure satisfy the following equation:

$$1 \leq nPET/nA \geq 0.995;$$

where nPET represents the refractive index of the substrate 120, and nA represents the refractive index of the thin film 122. However, the present disclosure is not limited thereto, and any other suitable equation is applicable to the present disclosure.

Figure 2A:
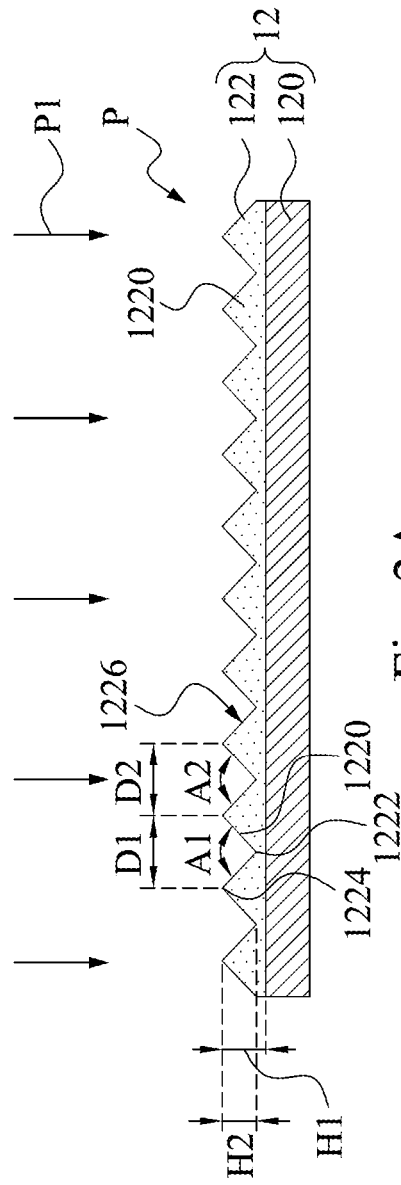
Figure 2B:
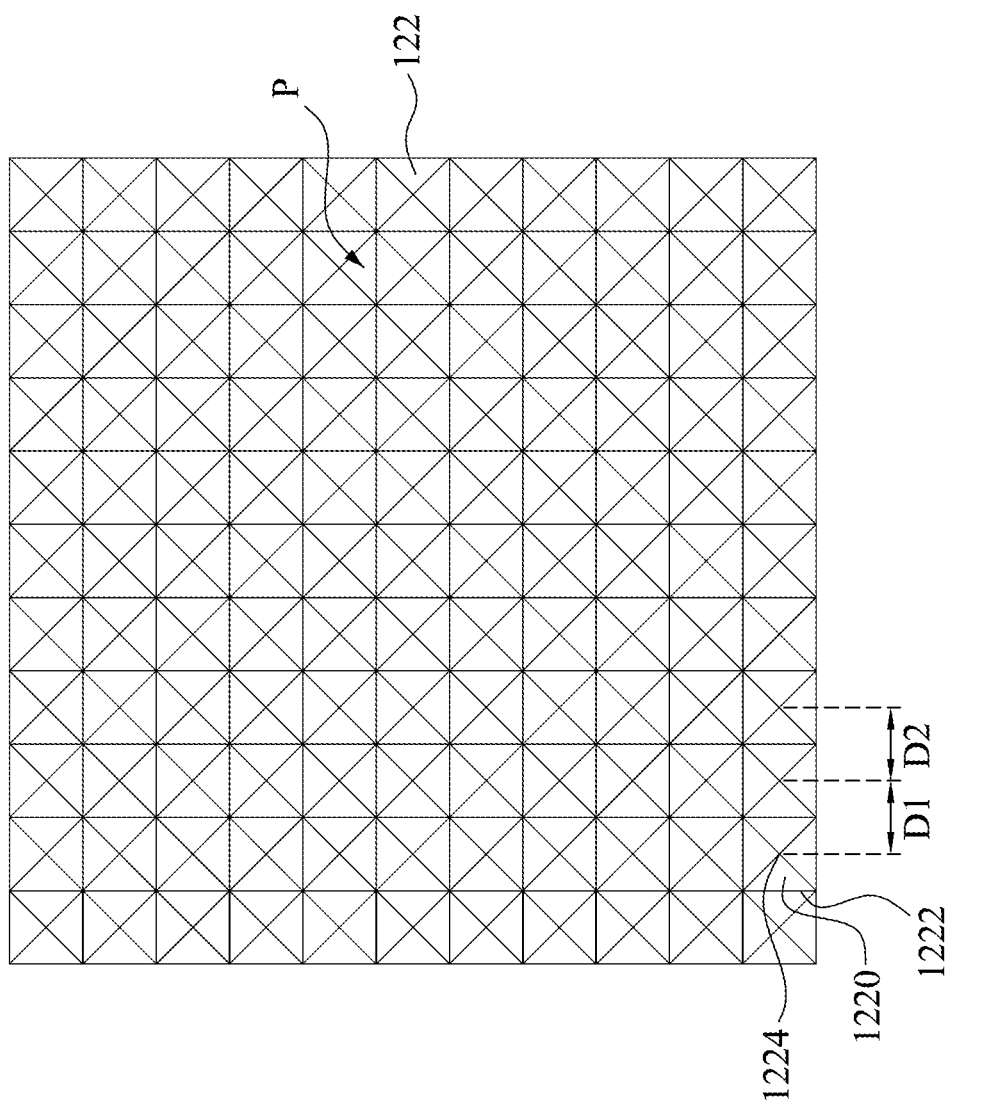
FIG. 2B is a top view of FIG. 2A.

As shown in FIGS. 2A and 2B, after forming the transferring layer 12, recess structures 1220 are formed on the thin film 122 of the transferring layer 12. Specifically, a pattern P of the present disclosure is formed on the thin film 122 to form the recess structures 1220 by a transferring process P1. For example, the transferring process P1 of the present disclosure fabricates a microstructure having the pattern P on a motherboard (not shown), thereby enabling the pattern P on the motherboard to be transferred to the thin film 122 to form the recess structures 1220 that is complementary to the microstructure on the motherboard.

The recess structures 1220 of the present disclosure are uniformly formed on the thin film 122 of the transferring layer 12 in a regular manner of a multi-dimensional arrangement. The aforementioned multi-dimensional arrangement means that bottom portions 1222 and top portions 1224 of the recess structures 1220 are configured to arrange in a staggered manner. The top portion 1224 of the recess structure 1220 has a first height H1 relative to the substrate 120, and the first height H1 is substantially less than 5 μm. The top portion 1224 of the recess structure 1220 has a second height H2 relative to the bottom portion 1222, and a ratio of the second height H2 to the first height H1 is between about 0.05 and about 0.5. Every two adjacent top portions 1224 of the recess structures 1220 have a first distance D1 or a second distance D2 therebetween. In the embodiment, the first distance D1 is substantially equal to the second distance D2. In other embodiments, the first distance D1 is different from the second distance D2 to form the recess structures 1220. As such, the recess structures 1220 form sparse patterns and dense patterns distributed in an alternative manner.

Furthermore, a first angle A1 is included between two inner walls 1226 of one of two adjacent recess structures 1220, and a second angle A2 is included between inner walls 1226 of the other one of the two adjacent recess structures 1220. In the embodiment, the first angle A1 is substantially the same as the second angle A2, and is in a range from about 45° to about 135°. In other embodiments, the first angle A1 is different from the second angle A2. In some embodiments, a roughness surface area ratio (RSAR) of the recess structures 1220 is substantially between about 1.1 and about 2.6.

Figure 3:
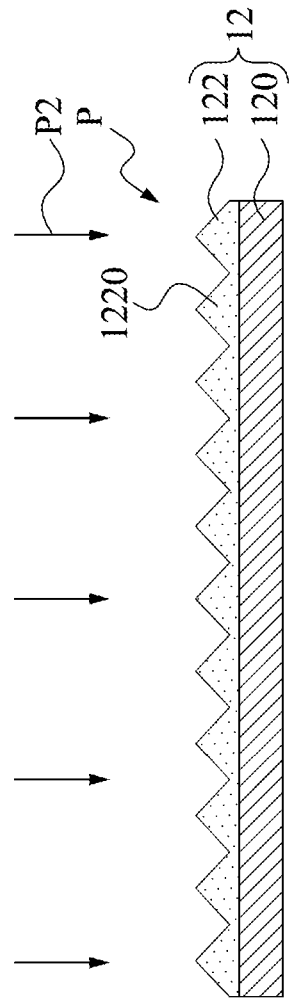

As shown in FIG. 3, after the pattern P is formed on the thin film 122 of the transferring layer 12, the thin film 122 is cured by the curing process P2. In some embodiments, the curing process P2 may include a thermal curing process or a light curing process.

As shown in FIG. 4, after the thin film 122 is cured, a dielectric layer 14 is formed on the thin film 122 of the transferring layer 12, thus collectively forming a stacking structure 10. That is, the stacking structure 10 includes the transferring layer 12 and the dielectric layer 14. Furthermore, the operation of forming the dielectric layer 14 on the transferring layer 12 transfers the recess structures 1220 of the transferring layer 12 to form protruding structures 140 complementary to the recess structures 1220 on a side of the dielectric layer 14 facing the transferring layer 12. The protruding structures 140 are uniformly distributed on the dielectric layer 14. Each of the protruding structures 140 has a straight outline profile (as shown by two side walls 148 in FIG. 4), and is at least located in the recess structure 1220 of the thin film 122, such that the dielectric layer 14 is embedded with the recess structure 1220 of the thin film 122 through the protruding structures 140.

In the embodiment, the method for forming the dielectric layer 14 on the transferring layer 12 includes a coating process, and the dielectric layer 14 is formed from a photoimageable dielectric (PID) material, but the present disclosure is not limited thereto. In some embodiments, a refractive index of the dielectric layer 14 and a refractive index of the thin film 122 of the transferring layer 12 satisfy the following equation:

$$1 \geq nA/nPID \geq 0.998;$$

where nPID represents the refractive index of the dielectric layer 14 and nA represents the refractive index of the thin film 122. However, the present disclosure is not limited thereto, and any other suitable equation is applicable to the present disclosure.

Because the protruding structures 140 of the dielectric layer 14 are complementary to the recess structures 1220 of the transferring layer 12, the protruding structures 140 have substantially the same RSAR as the motherboard and/or the recess structures 1220, and have the same surface profile as the motherboard. In some embodiments, the RSAR of the protruding structures 140 of the dielectric layer 14 is substantially between about 1.1 and 2.6. Specifically, if a RSAR of a surface of the dielectric layer 14 opposite to the base board 16 is greater than 2.6, it is difficult to form a fine circuit on the aforementioned surface. On the other hand, if the RSAR of the surface of the dielectric layer 14 opposite to the base board 16 is less than 1.1, the aforementioned surface cannot provide a sufficient contact area to provide a bonding force between the dielectric layer 14 and a circuit formed thereon by subsequent processes, thus causing the aforementioned circuit to be separated from the dielectric layer 14 in subsequent processes, in which the separation of the aforementioned circuit and the dielectric layer 14 may result in a blister problem in the circuit board 1.

Therefore, the protruding structures 140 complementary to the recess structures 1220 of the transferring layer 12 are formed on the dielectric layer 14 by a transferring method, so as to control the RSAR of the protruding structures 140. As such, the RSAR of the protruding structures 140 of the present disclosure may be controlled within a range from about 1.1 to about 2.6 by using the recess structures 1220 of the transferring layer 12, thereby enhancing a binding force between the dielectric layer 14 and the fine circuit to be formed by the subsequent processes, thereby preventing the circuit board 1 from having a blister problem caused by a subsequent baking process.

As shown in FIG. 5, a base board 16 is provided. The base board 16 of the present disclosure has a first surface 160 and a second surface 162 opposite to the first surface 160. The base board 16 may be a ceramic plate, a metal plate, an organic board, or any other suitable structure. Subsequently, first circuit layers 18 are respectively formed on the first surface 160 and the second surface 162 of the base board 16. Subsequently, after the stacking structures 10 are formed, the stacking structures 10 are respectively bonded on the first surface 160 and the second surface 162 of the base board 16 by pressing, such that the dielectric layers 14 of the stacking structures 10 are in contact with the first surface 160 and the second surface 162 of the base board 16, and the first circuit layers 18 are embedded in the dielectric layers 14 of the stacking structures 10 respectively. In the embodiment, the method for bonding the stacking structures 10 on the base board 16 by pressing includes a vacuum pressing process, but the present disclosure is not limited thereto. Furthermore, a tool used for the vacuum pressing process of the present disclosure may include a batch type single-stage pressing machine or a batch type multi-stage pressing machine.

Figure 6:
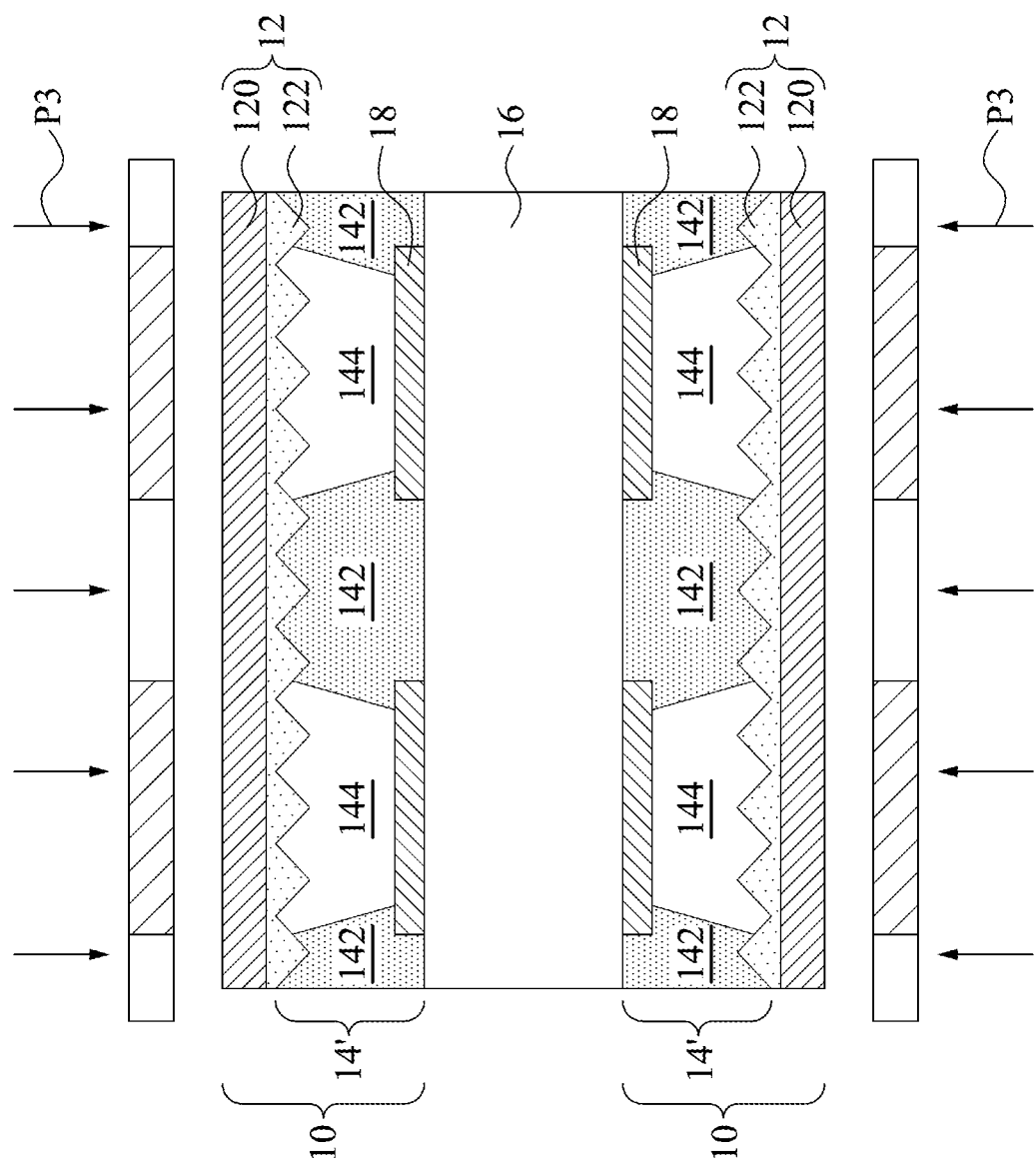

As shown in FIG. 6, after the stacking structure 10 is bonded to the base board 16 by pressing, the dielectric layer 14 is patterned. Furthermore, an exposure process P3 is performed on the stacking structure 10 through the transferring layer 12, so as to form an exposure region 142 and a non-exposure region 144 on the dielectric layer 14 of the stacking structure 10. For example, a tool used for the exposure process P3 may include a direct imaging tool, a laser direct imaging tool, a stepper tool, a contacting exposure tool, or any other suitable tool. Because the refractive index of the dielectric layer 14 of the present disclosure is substantially the same as the refractive index of the transferring layer 12, and is matched with the refractive index of the transferring layer 12. The transferring layer 12 does not affect the exposure of the dielectric layer 14 during the process of performing the exposure process P3, so that the designed exposure region 142 and non-exposure region 144 can be formed one the dielectric layer 14.

Figure 7:
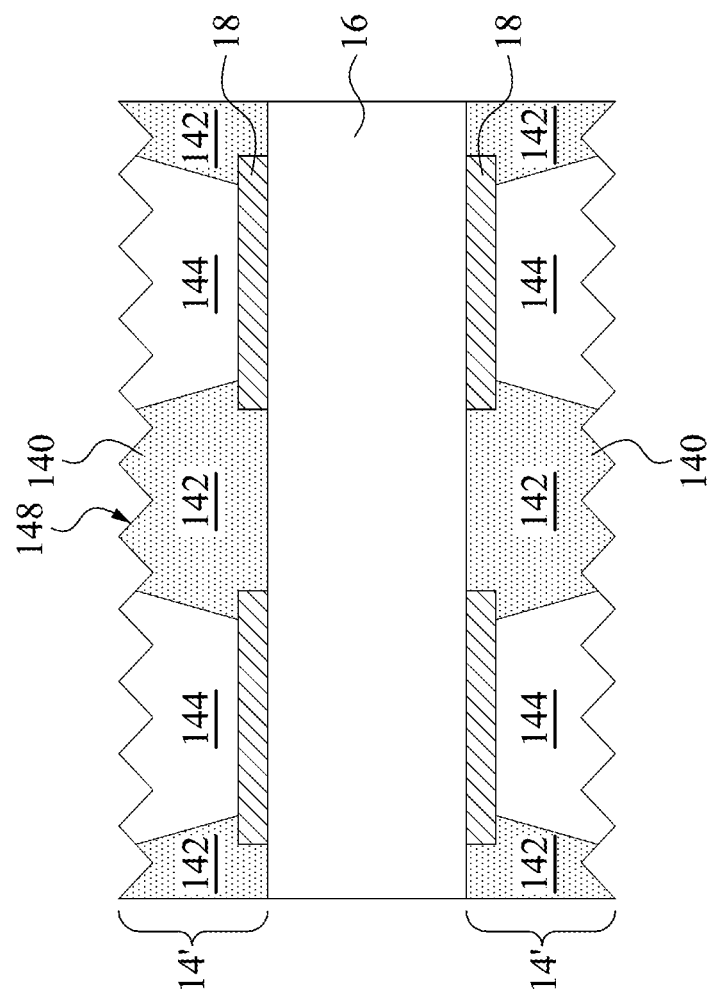

As shown in FIG. 7, after the exposure process P3 is finished, the transferring layer 12 is removed to expose the exposed dielectric layer 14'. That is, on the exposed dielectric layer 14', the protruding structure 140 complementary to the recess structures 1220 of the transferring layer 12 is exposed. As such, the present disclosure does not require an additional etching process to form a non-uniform coarse structure on the surface of the exposed dielectric layer 14' opposite to the base board 16, and thus the associated etching process (e.g., a wet etching process) can be omitted, thereby simplifying a manufacturing process and reducing a manufacturing cost.

Figure 8:
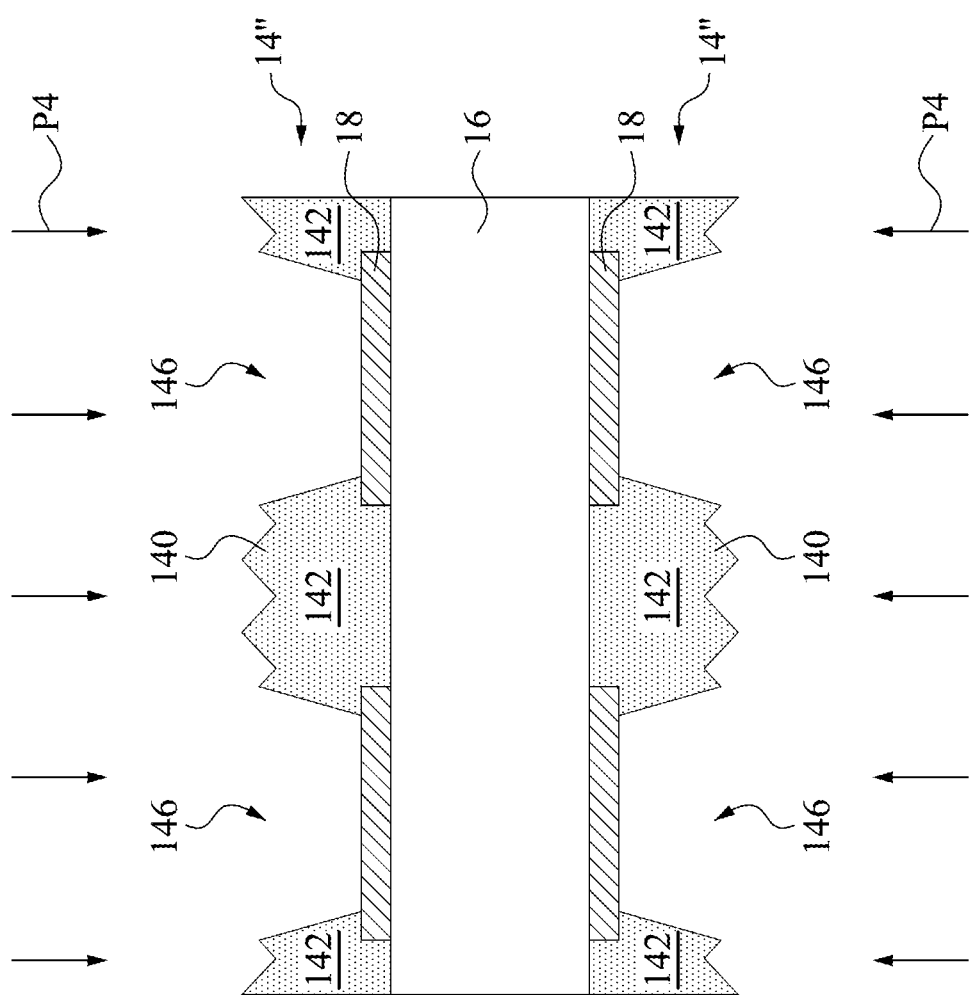

As shown in FIG. 8, after the transferring layer 12 is removed, the exposed dielectric layer 14' is performed by a developing process P4 to form the patterned dielectric layer 14". Furthermore, the non-exposure region 144 of the exposed dielectric layer 14' is removed by the developing process P4, and the exposure region 142 of the exposed dielectric layer 14' is remained, such that through holes 146 and the patterned dielectric layer 14" are formed. The first circuit layer 18 is exposed through the through holes 146. Subsequently, after the developing process P4 is finished, the patterned dielectric layer 14" is cured by a curing process. In some embodiments, the curing process may include a thermal curing process, a light curing process, a combination thereof, or any other suitable process.

Figure 9:
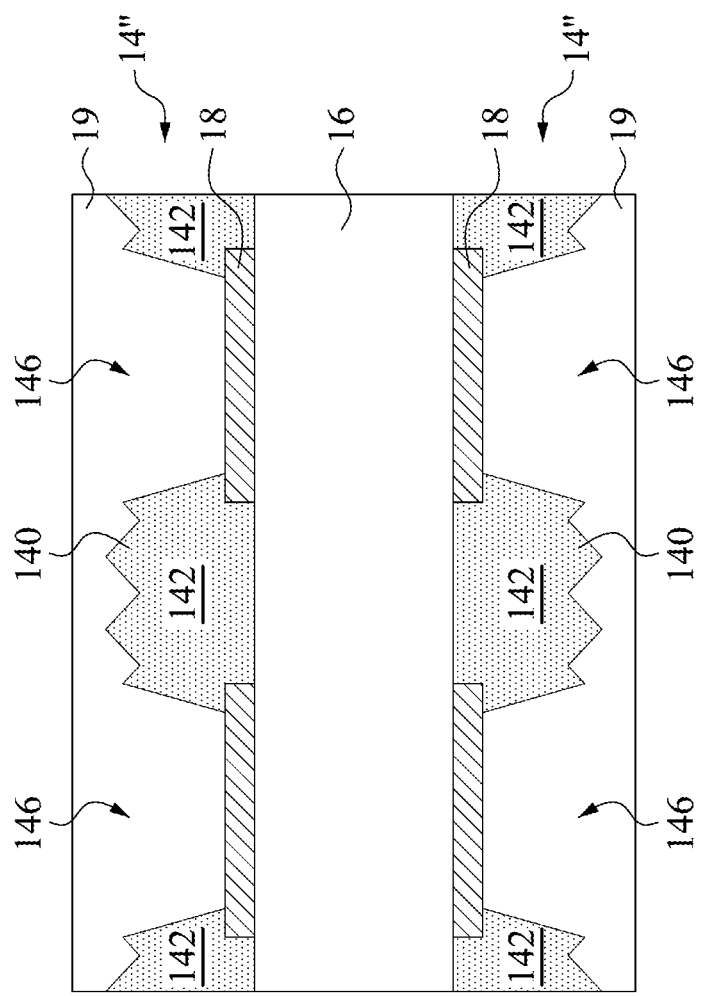

As shown in FIG. 9, after the patterned dielectric layers 14" is formed, second circuit layers 19 are formed on the patterned dielectric layers 14" respectively, and are formed in the through holes 146, and are in contact with the first circuit layers 18. The second circuit layer 19 is at least embedded with the protruding structure 140 on the exposure region 142 of the exposed dielectric layer 14'. In the embodiment, the method for forming the second circuit layer 19 on the patterned dielectric layer 14" includes an electroplating process, but the present disclosure is not limited thereto. In the embodiment, the second circuit layer 19 is made of copper (Cu). In some embodiments, the second circuit layer 19 is made of aluminum (Al), but the present disclosure is not limited thereto, and any other suitable material is applicable to the present disclosure.

Because the RSAR of the protruding structure 140 of the present disclosure is controlled to be between about 1.1 and about 2.6, a contact area between the second circuit layer 19 and the patterned dielectric layers 14" can be increased, thereby enhancing a bonding force between the second circuit layer 19 and the patterned dielectric layers 14", and reducing the probability of separating the second circuit layer 19 from the patterned dielectric layers 14" due to lack of a bonding force therebetween.

Figure 10:
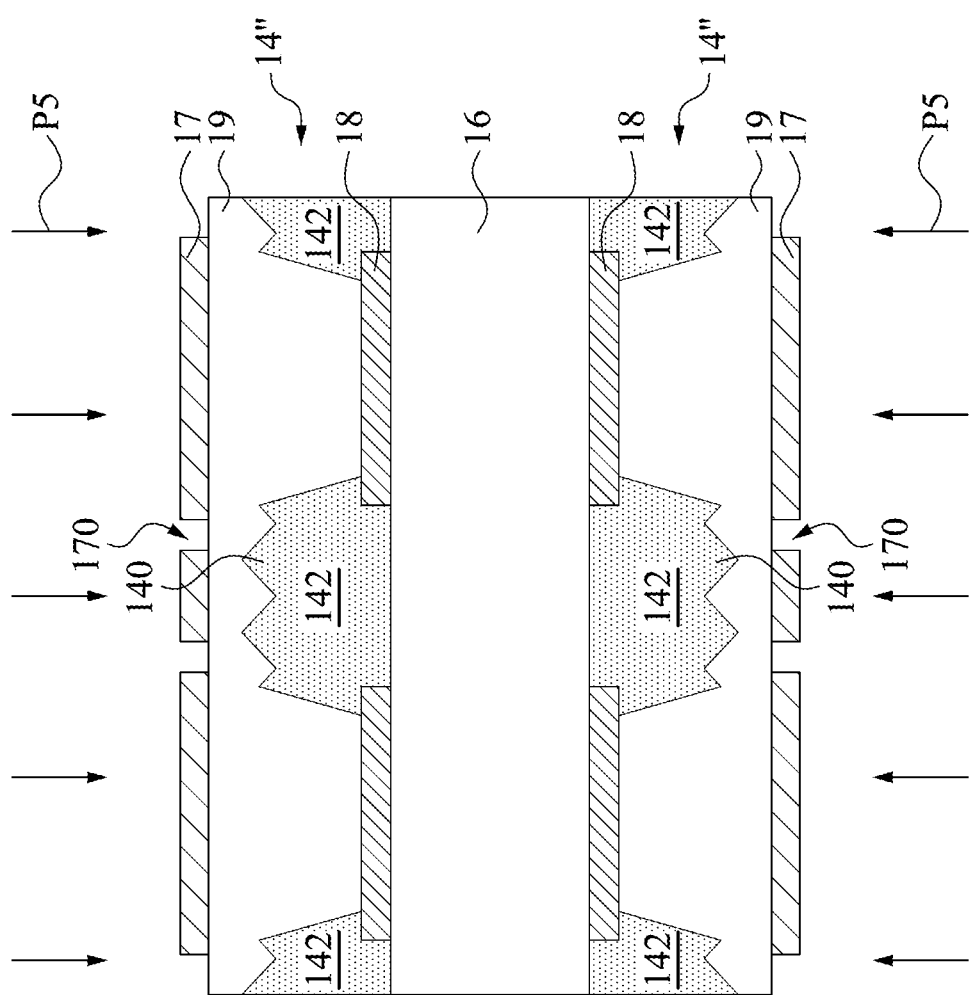

As shown in FIG. 10, after the second circuit layer 19 is formed, a photoresist layer 17 is formed on the second circuit layer 19. The photo resist layer 17 of the present disclosure is disposed corresponding to the first circuit layer 18, and has openings 170 thereon to expose a portion of the second circuit layer 19. The photoresist layer 17 can cover and protect a portion of the second circuit layer 19. Subsequently, another portion of the second circuit layer 19 exposed from the openings 170 of the photoresist layer 17 is etched by an etching process P5.

Figure 11:
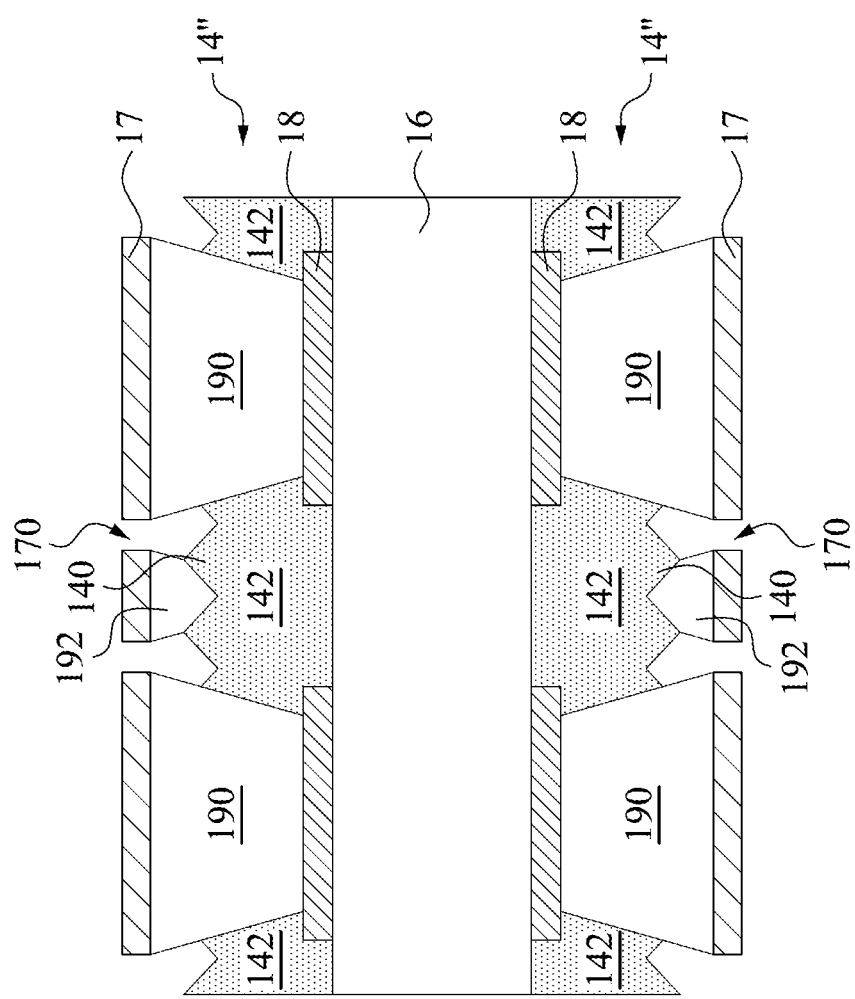

As shown in FIG. 11, after the etching process P5 is finished, the second circuit layer 19 is patterned to form a first conducting circuit 190 and a second conducting circuit 192.

Figure 12:
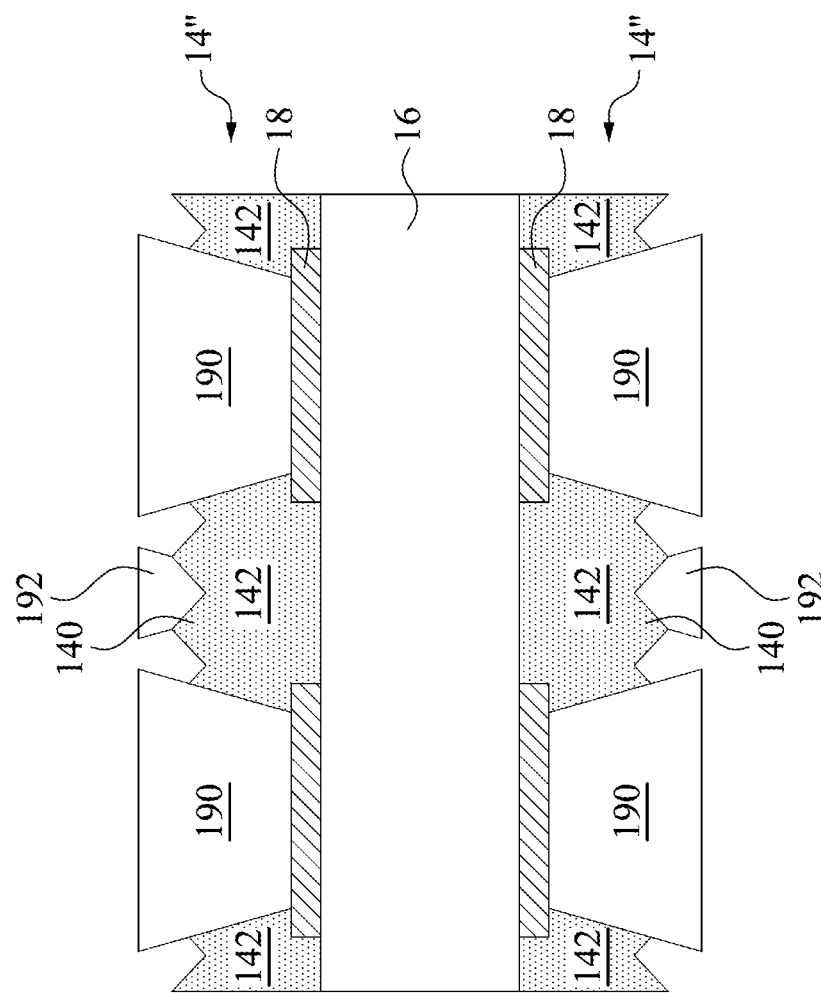

As shown in FIG. 12, after the first conducting circuit 190 and a second conducting circuit 192 are formed, the photoresist layer 17 is removed, and the circuit board 1 of the present disclosure is completed. Specifically, the first conducting circuit 190 is at least located in the through hole 146 and is connected to the first circuit layer 18. The second conducting circuit 192 is disposed on the exposure region 142 of the exposed dielectric layer 14' and is separated from the first conducting circuit 190. Because the RSAR of the protruding structure 140 of the present disclosure is controlled to be between about 1.1 and about 2.6, a contact area between the second conducting circuit 192 and the patterned dielectric layers 14" can be increased, thereby enhancing a bonding force between the second conducting circuit 192 and the patterned dielectric layers 14" to miniaturize the line width of the conducting circuit 192, thereby preventing the second conducting circuit 192 from being separated from the patterned dielectric layers 14", in which the separation may results in a blister problem in the circuit board 1 in subsequent processes. For example, the line width of the conducting circuit 192 of the present disclosure to be formed by the subsequent processes can be less than 30 μm.

Furthermore, in the embodiment, the protruding structures 140 on the patterned dielectric layers 14" are exposed between the first conducting circuit 190 and the second conducting circuit 192, thereby enabling the protruding structures 140 to contact other structures to be formed by subsequent processes, thereby enhancing a bonding force between the patterned dielectric layers 14" and the structures to be formed by the subsequent processes, and avoiding the separation between the patterned dielectric layers 14" and the structures, in which the separation may result in defects in the circuit board 1.

Figure 13:
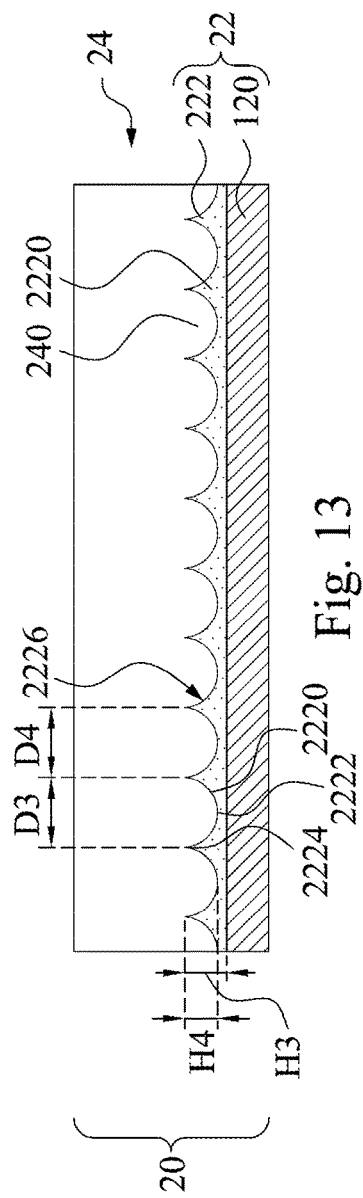
FIGS. 13 and 14 are cross-sectional views of another circuit board at various stages of fabrication in accordance with some embodiments of the present disclosure.

Reference is made to FIG. 13. FIG. 13 is cross-sectional view of another stacking structure 20 in accordance with some embodiments of the present disclosure. As shown in FIG. 13, the stacking structure 20 includes a transferring layer 22 and a dielectric layer 24. The transferring layer 22 of the stacking structure 20 further includes a substrate 120 and a thin film 222, and the structure and function of the components and their relationships are substantially the same as the stacking structure 10 shown in FIGS. 1 to 4, and the related detailed descriptions may refer to the foregoing paragraphs, and are not discussed again herein. It is noted that, the difference between the present embodiment and that in FIGS. 1 to 4 are in that an inner wall 2226 of a recess structure 1220 on the transferring layer 22 of the present disclosure has a curved profile recessed toward the substrate 120, but not has a straight outline profile as the inner wall 1226 shown in FIGS. 2A and 2B.

The recess structures 2220 are uniformly formed on the thin film 222 of the transferring layer 22 in a regular manner of a multi-dimensional arrangement. The aforementioned multi-dimensional arrangement means that bottom portions 2222 and top portions 2224 of the recess structures 2220 are configured to arrange in a staggered manner. The top portion 2224 of the recess structures 2220 has a first height H3 relative to the substrate 120, and the first height H3 is substantially less than about 5 μm. The top portion 2224 of the recess structure 2220 has a second height H4 relative to the bottom portion 2222, and a ratio of the second height H4 to the first height H3 is between about 0.05 and about 0.5. The two adjacent top portions 2224 of the recess structures 2220 have a first distance D3 or a second distance D4 therebetween. In the embodiment, the first distance D3 is substantially equal to the second distance D3. In other embodiment, the first distance D3 is different from the second distance D4, so as to form the recess structures 2220. As such, the recess structures 2220 form sparse patterns and dense patterns distributed in an alternative manner. In some embodiments, a roughness surface area ratio (RSAR) of the recess structures 2220 is substantially between about 1.1 and about 2.6.

Because the protruding structures 240 of the dielectric layer 24 are complementary to the recess structures 2220 of the transferring layer 22, the protruding structures 240 have substantially the same RSAR as the motherboard and/or the recess structures 2220, and have the same surface profile as the motherboard. In some embodiments, the RSAR of the protruding structures 240 of the dielectric layer 24 is substantially between about 1.1 and 2.6. Specifically, if a RSAR of a surface of the dielectric layer 24 opposite to the base board 16 is larger than 2.6, it is hard to form a fine circuit on the aforementioned surface. On the other hand, if the RSAR of the surface of the dielectric layer 24 opposite to the base board 16 is less than 1.1, the aforementioned surface cannot provide a sufficient contact area to provide a bonding force between the dielectric layer 24 and a circuit formed thereon by subsequent processes, thereby enabling the dielectric layer 24 to be separated from the aforementioned circuit in subsequent processes, which resulting in a blister problem in the circuit board 2.

Therefore, the protruding structures 240 complementary to the recess structures 2220 (shown in FIG. 13) on the transferring layer 22 are formed on the dielectric layer 24 by a way of transfer to control the RSAR of the protruding structures 240. As such, the RSAR of the protruding structures 240 of the present disclosure can be controlled in a range from about 1.1 to about 2.6 by the recess structures 2220 on the transferring layer 22, thereby enhancing a bonding force between the dielectric layer 24 and the fine circuit formed by the subsequent processes, and preventing the circuit board 2 from having a blister problem due to a subsequent baking process.

Figure 14:
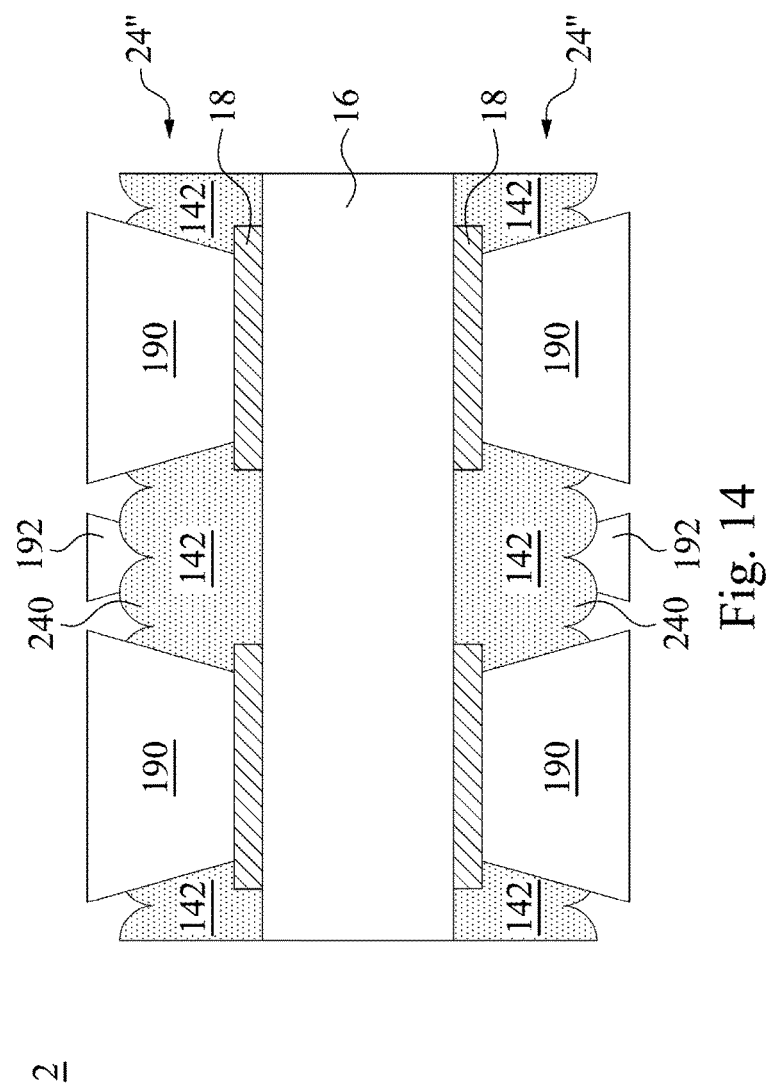

Furthermore, it is noted that, various stages of fabrication that between FIG. 13 and FIG. 14 of the present disclosure are substantially the same as the steps of fabrication shown in FIGS. 5 to 11, and the related detailed descriptions may refer to the foregoing paragraphs and are not discussed again herein.

Reference is made to FIG. 14. FIG. 14 is a cross-sectional of another circuit board 2 in accordance with some embodiments of the present disclosure. As shown in FIG. 14, the circuit board 2 of the present disclosure includes the base board 16, the first circuit layers 18, a patterned dielectric layer 24", the first conducting circuit 190, and the second conducting circuit 192, and the structure and function of the components and their relationships are substantially the same as the circuit board 1 shown in FIGS. 1 to 12, and the related detailed descriptions may refer to the foregoing paragraphs, and are not discussed again herein. It is noted that, the difference between the present embodiment and that in FIGS. 1 to 12 is in that the protruding structure 240 on the dielectric layer 24 of the present disclosure has a curved profile recessed toward the base board 16, but does not have a straight outline profile of the protruding structure 140 shown in FIG. 12. Therefore, the protruding structure 140 shown in FIG. 10 is replaced by the protruding structure 240 of the present disclosure.

According to the foregoing embodiments of the disclosure, it can be seen that, because the RSAR of the protruding structure 240 of the present disclosure is controlled to be between about 1.1 and about 2.6, a contact area between the second conducting circuit 192 and the dielectric layer 24 can be increased, thereby enhancing a bonding force between the second conducting circuit 192 and the dielectric layer 24 to miniaturize the line width of the conducting circuit 192, and thereby preventing the circuit board 2 from a blister problem due to the subsequent processes. For example, the line width of the conducting circuit 192 of the present disclosure formed by the subsequent processes can be less than 30 µm.

In some embodiments, a stacking structure is applicable to manufacturing a circuit board. The stacking structure includes a transferring layer and a dielectric layer disposed on the transferring layer. The transferring layer includes a substrate and a thin film disposed on the substrate and having a plurality of recess structures thereon. The recess structures are connected as a single piece and bottom portions and top portions of the recess structures are configured to arrange in a staggered manner to form a multi-dimensional arrangement. At least a portion of the dielectric layer being is located in the recess structures, such that the dielectric layer is at least embedded with the recess structures.

In some embodiments, two straight sidewalls of at least one of the recessed structures intersect to form a sharp corner when viewed in a cross section.

In some embodiments, a roughness surface area ratio (RSAR) of the recess structures is in a range from about 1.1 to about 2.6.

In some embodiments, the thin film is made of epoxy, acrylic resin, cyclic-Olefin, or combinations thereof.

In some embodiments, the thin film has a height less than about 5 µm.

In some embodiments, the thin film has a refractive index greater than the substrate.

In some embodiments, a ratio of a refractive index of the substrate to a refractive index of the thin film is in a range from about 1 to about 0.995.

In some embodiments, the substrate is formed of polyethylene terephthalate.

In some embodiments, the thin film has a material different than the substrate.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A stacking structure applicable to manufacturing a circuit board, the stacking structure comprising:
    a transferring layer, comprising:
        a substrate; and
        a thin film continuously extending over the substrate and having a plurality of recess structures thereon, wherein the recess structures are connected as a single piece, bottom portions and top portions of the recess structures are configured to arrange in a staggered manner to form a multi-dimensional arrangement; and
    a dielectric layer disposed on the transferring layer, wherein at least a portion of the dielectric layer is located in the recess structures, such that the dielectric layer is at least embedded with the recess structures.

2. The stacking structure of claim 1, wherein two straight sidewalls of at least one of the recessed structures intersect to form a sharp corner from a cross section view.

3. The stacking structure of claim 1, wherein a roughness surface area ratio (RSAR) of the recess structures on the thin film to a top surface of the substrate is in a range from about 1.1 to about 2.6.

4. The stacking structure of claim 1, wherein the thin film has a height less than about 5 µm.

5. The stacking structure of claim 1, wherein the thin film has a refractive index greater than the substrate.

6. The stacking structure of claim 1, wherein a ratio of a refractive index of the substrate to a refractive index of the thin film is in a range from about 1 to about 0.995.

7. The stacking structure of claim 1, wherein the thin film has a material different than the substrate.

8. The stacking structure of claim 1, wherein the thin film is made of epoxy, acrylic resin, cyclic-Olefin, or combinations thereof.

9. The stacking structure of claim 1, wherein the substrate is formed of polyethylene terephthalate.

* * * * *